United States Patent
Sanders

(10) Patent No.: US 6,263,386 B1
(45) Date of Patent: Jul. 17, 2001

(54) COMPUTER SYSTEM HAVING CONDITION SENSING FOR INDICATING WHETHER A PROCESSOR HAS BEEN INSTALLED

(75) Inventor: Michael C. Sanders, Spring, TX (US)

(73) Assignee: Compaq Computer Corporation, Houston, TX (US)

(*) Notice: Subject to any disclaimer, the term of this patent is extended or adjusted under 35 U.S.C. 154(b) by 0 days.

(21) Appl. No.: 09/249,184

(22) Filed: Feb. 12, 1999

(51) Int. Cl.[7] .............................. G06F 13/00; H05K 7/10
(52) U.S. Cl. ........................ 710/101; 710/102; 710/103
(58) Field of Search ............................. 710/101, 102, 710/103; 712/32; 361/785, 807, 809; 439/55, 68, 75

(56) References Cited

U.S. PATENT DOCUMENTS

| | | | |
|---|---|---|---|
| 4,084,869 | * | 4/1978 | Yen . |
| 5,384,692 | * | 1/1995 | Jaff . |
| 5,442,520 | * | 8/1995 | Kemp et al. . |
| 5,590,363 | * | 12/1996 | Lunsford et al. . |
| 5,832,294 | * | 11/1998 | Reinschmidt . |
| 6,108,731 | * | 8/2000 | Suzuki et al. . |

* cited by examiner

Primary Examiner—Gopal C. Ray
(74) Attorney, Agent, or Firm—Fletcher, Yoder & Van Someren

(57) ABSTRACT

A system for providing a signal indicating whether a processor is installed and providing improved voltage regulation. A contact is selected and isolated from an array of ground contacts and is further coupled with circuit for generating an INSTALL signal. A capacitor and pull up resistor coupled to a supply voltage, ground and the isolated contact form a signal line at a common node such that a circuit to ground is completed through the processor and the isolated contact when the processor is plugged in and a direct signal indication of the presence or absence of the processor is provided. Voltage sense lines of a Voltage Regulation Module (VRM) are coupled directly to processor contacts isolated from an existing voltage supply contacts coupled to the supply plane of a supply voltage within the circuit board providing improved regulation without adversely affecting power supply current capacity considerations.

7 Claims, 4 Drawing Sheets

COMPUTER SYSTEM HAVING CONDITION SENSING FOR INDICATING WHETHER A PROCESSOR HAS BEEN INSTALLED

FIELD OF THE INVENTION

The present invention relates to improved circuits for sensing conditions related to a processor. In particular, the present invention relates to improvements including sensing whether a processor is installed in a circuit and sensing processor supply voltages.

BACKGROUND OF THE INVENTION

As processor packaging formats become larger and more complex, containing larger memory caches and being serviced by high speed high capacity busses, problems arise related to determining whether the processor is installed, and whether voltage may be applied, and, once applied, determining how best to regulate the voltage.

In prior art processors, a loop circuit may be used to detect power enable and, by derivation whether the processor is installed and fully seated. Because of the possibility of part damage due to currents from improperly seated parts and resulting poor electrical connections, it is crucial not to apply power unless a processor is fully installed. Such currents may cause the processor itself, the package contacts, and the cartridge to be damaged. Loop circuits have been used, as noted, to derive whether the processor is seated electrically based on the power enable signal as described. Such a derived approach has disadvantages in that the signal must be present for the system to power up. This signal is inappropriate to use as an indicator of a processor or terminator card being installed.

Another factor affecting processor operation is voltage regulation. A typical VRM associated with a processor circuit board has sense lines which allow for better regulation of supplied voltages by providing references to supplied voltages. Problems arise in that sense lines for regulating voltages on a typical circuit board to which a processor may be coupled may be connected to a voltage supply plane in close proximity to the VRM. Sensing voltages at the voltage supply plane of the circuit board may not accurately reflect the true state of voltages which most affect processor operation at a point which most accurately characterizes the voltage levels as they are seen by the processor. Further, voltage drops from circuits within the processor where the supply voltages are used to voltage supply planes where voltage levels are sensed may result in poor or inadequate voltage regulation where it is needed the most, e.g. to regulate voltage supply planes used in the processor.

It would be desirable therefore for an apparatus and method for providing an indication that a processor is properly seated and ready for the application of voltage. It would further be desirable for an apparatus and method which provides for improved regulation for internal processor voltages.

SUMMARY OF THE INVENTION

The present invention overcomes the above identified problems as well as other shortcomings and deficiencies of existing technologies by providing a signal to indicate whether the processor is installed. A contact, selected and isolated from an array of contacts used to provide a ground connection for the processor is coupled with circuit for generating a corresponding INSTALL signal indicating whether a processor is installed. The circuit of the present invention allows the difference between the installation of a processor and the installation of a socket terminator or power-enable card to be detected. One or more contacts forming a portion of the ground plane or grid of a circuit board may be isolated from an existing plurality of contacts in the ground plane. A pull up resistor may be coupled to a supply voltage and the isolated contact and a capacitor may be coupled between the isolated contact and ground plane and a signal line may be coupled to the common node between the resistor, the capacitor, and the isolated contact such that when the processor plugged in, a circuit is completed through the processor between the ground plane and the isolated contact and thus the signal line. The signal is pulled low to ground when the processor is plugged in and is pulled high when the processor is not plugged in, thus providing a direct signal indication of the presence or absence of the processor. It is to be noted that the present invention can be practiced without adversely affecting ground sourcing capacity considerations for the processor.

To further address the shortcomings of the prior art, a circuit board accommodating a processor in accordance with the present invention may include a Voltage Regulation Module (VRM) having voltage sense lines. Voltage may be sensed directly from processor contacts in contrast to sensing voltages at respective power planes or grids within the circuit board leading to improved regulation particularly as processor demands change during operation. One or more voltage sense contacts may be isolated from an existing plurality of voltage supply contacts coupled to the supply plane or grid of a respective supply voltage within the circuit board without adversely affecting power supply current capacity considerations. For example, a contact from the cache voltage supply may be isolated for sensing the cache voltage directly at the processor when plugged in. Core voltage may also be measured in a similar manner by isolating a contact associated with the core voltage supply for sensing the core voltage directly at the processor.

BRIEF DESCRIPTION OF THE DRAWINGS

A more complete understanding of the present invention may be had by reference to the following Detailed Description and appended claims when taken in conjunction with the accompanying Drawings wherein:

DETAILED DESCRIPTION

Figure 1:
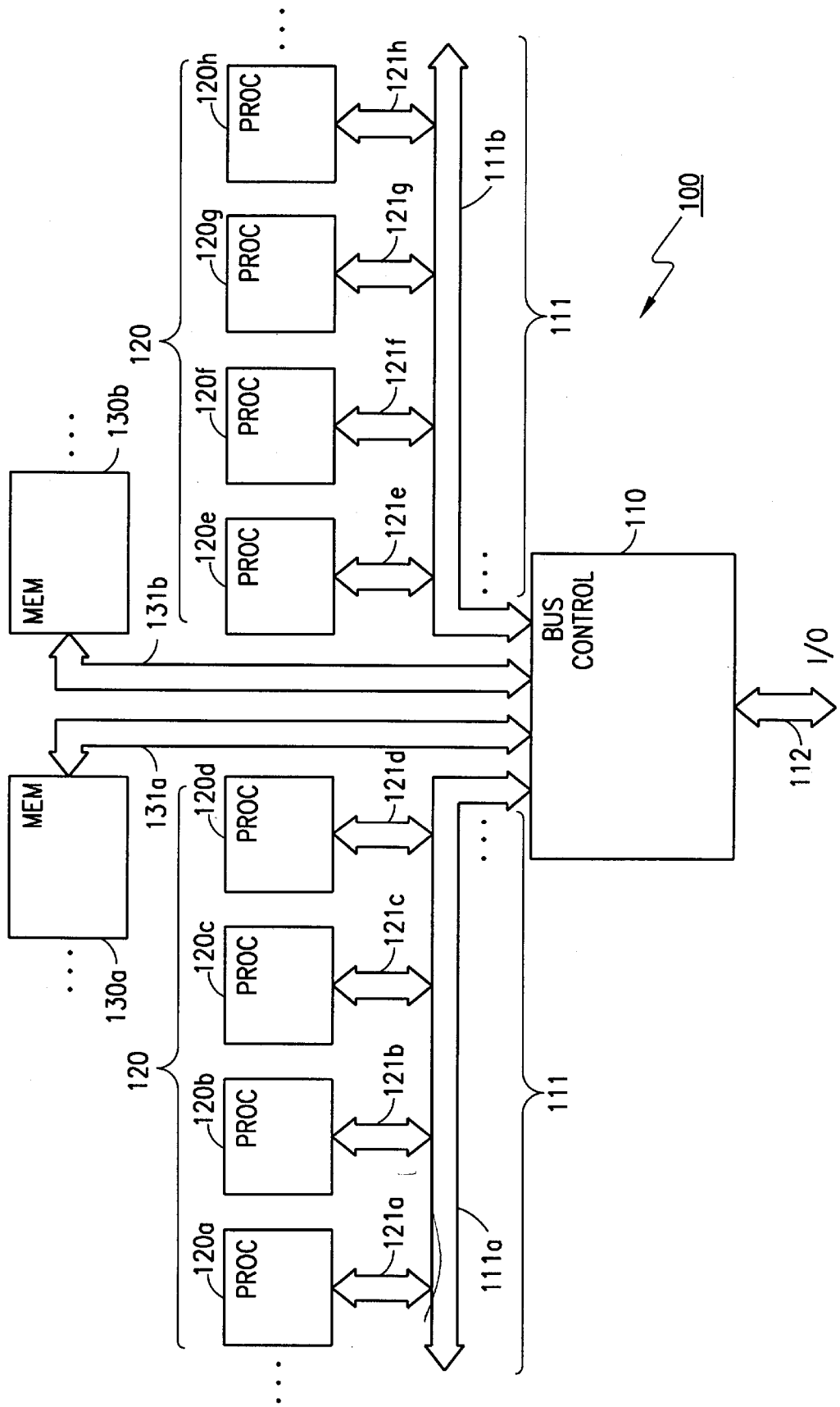
FIG. 1 is a block diagram illustrating an exemplary system in accordance with the present invention.

Referring to FIG. 1, a block diagram shows exemplary computer system 100 having multiple processors 120a–120h coupled to busses 111a and 111b through bus connections 121a–121h. In the preferred embodiment of the present invention, one or more processors may be present and, in particular, more or less than the eight processors 120a–120h may be present on one or more busses, as illustrated with exemplary busses 111a and 111b. Although two busses 111a and 111b are shown, more or fewer busses may be present in accordance with the present invention. Controller 110 may be used to manage bus activity on busses 111a and 111b and may further manage access between multiple processors 120a–120h and memory devices 130a and 130b. In the preferred embodiment of the present invention, memory devices 130a and 130b may be used to store address tags for maintaining cache coherency, as is known in the art, and may be high speed RAMs or like devices capable of fast access and data retrieval. Memory devices 130a and 130b may be accessed using busses 131a and 131b as shown in the diagram and controller 110. Controller 110 may be further coupled to additional resources including input devices such as keyboards, disk drives, additional memory, peripheral busses and associated devices, and through I/O bus 112. I/O bus 112 may be an input/output bus such as the PCI bus known in the art.

Figure 2:
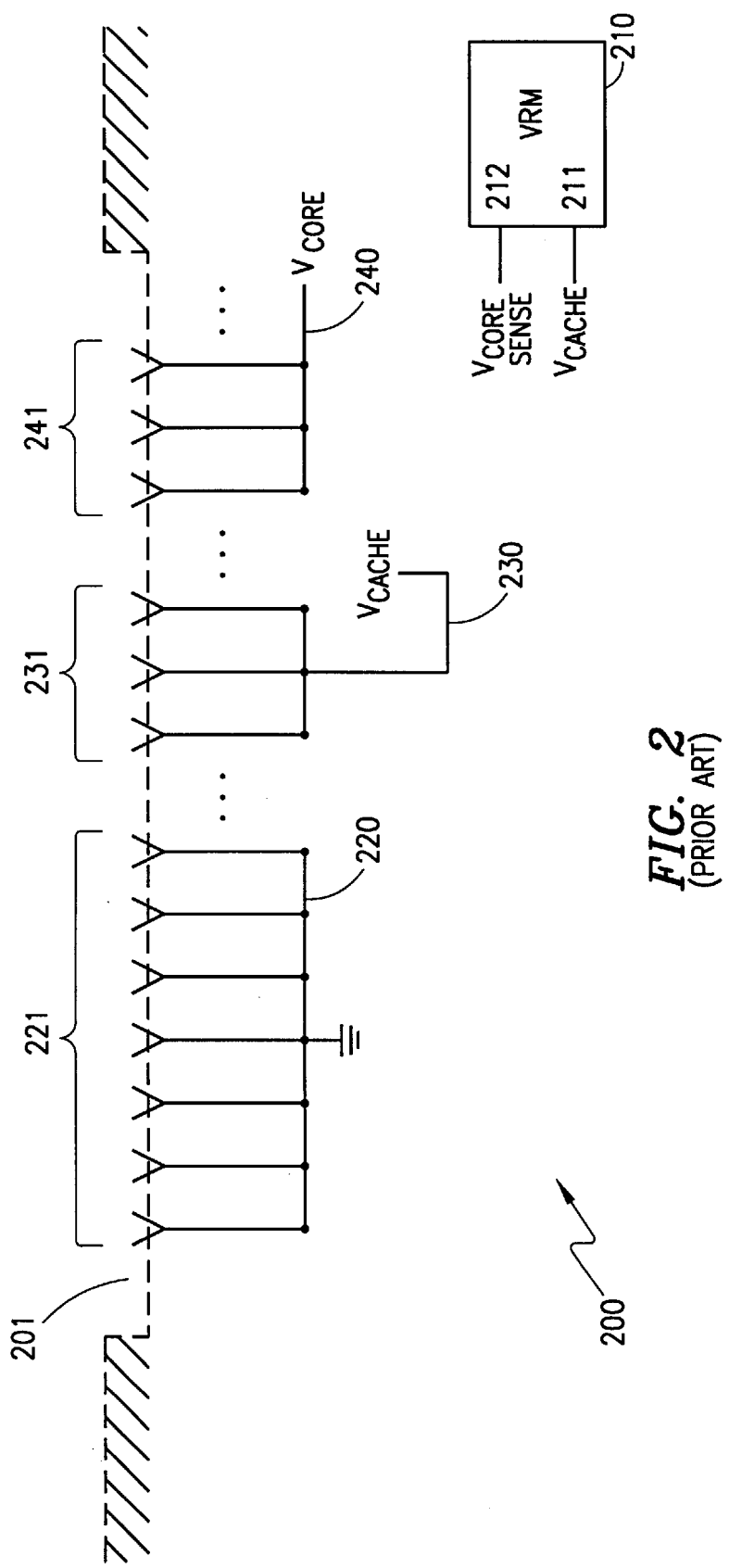
FIG. 2 is a schematic diagram illustrating a prior art circuit including ground and power contacts and an exemplary voltage regulation module.

While FIG. 1 shows multiple processors 120a–120h it is to be noted, as previously described, that the present invention may be practiced on a single processor or multiple processors. By way of example and not limitation, the remaining description is relevant to the present invention in the context of a single processor but could be applied to as many processors as may be present. Referring now to FIG. 2 of the drawings, a schematic of circuit board 200 shows socket 201 for accepting a processor. In prior art computer systems, such as computer system 100, a plurality of ground contacts 221 are grouped together to provide enhanced current sourcing capability from processor ground contacts to ground 220 which may be a ground plane or ground grid fabricated into or otherwise coupled to circuit board 200. Similarly, one or more voltage supplies may be provided to the processor through contacts 231 associated with, for example, $V_{CACHE}$ 230 and contacts 241 associated with, for example, $V_{CORE}$ 240. Voltage Regulation Module 210 may further be provided to regulate voltage supplies, for example, $V_{CACHE}$ 230 $V_{CORE}$ 240 by sensing voltage levels at respective voltage sense lines 211 and 212 respectively.

Problems arise, however, in merely connecting voltage sense lines 211 and 212 to a point on the voltage plane for the associated voltage supply. While the connection point may be convenient to the location of VRM 210, it may be remote from its point of use especially when the voltage supplies are used primarily or exclusively within the processor as m nay be the case, for example, with $V_{CACHE}$ 230 and $V_{CORE}$ 240. Voltage drops which may occur between VRM 210 and processor segments to which supply voltages are destined such as, for example, the processor core in the case of $V_{CORE}$ 240 and processor address cache in the case of $V_{CACHE}$ 230 may result in poor or inadequate regulation of voltage levels and, accordingly, may compromise the operation of the processor and the system.

Figure 3A:
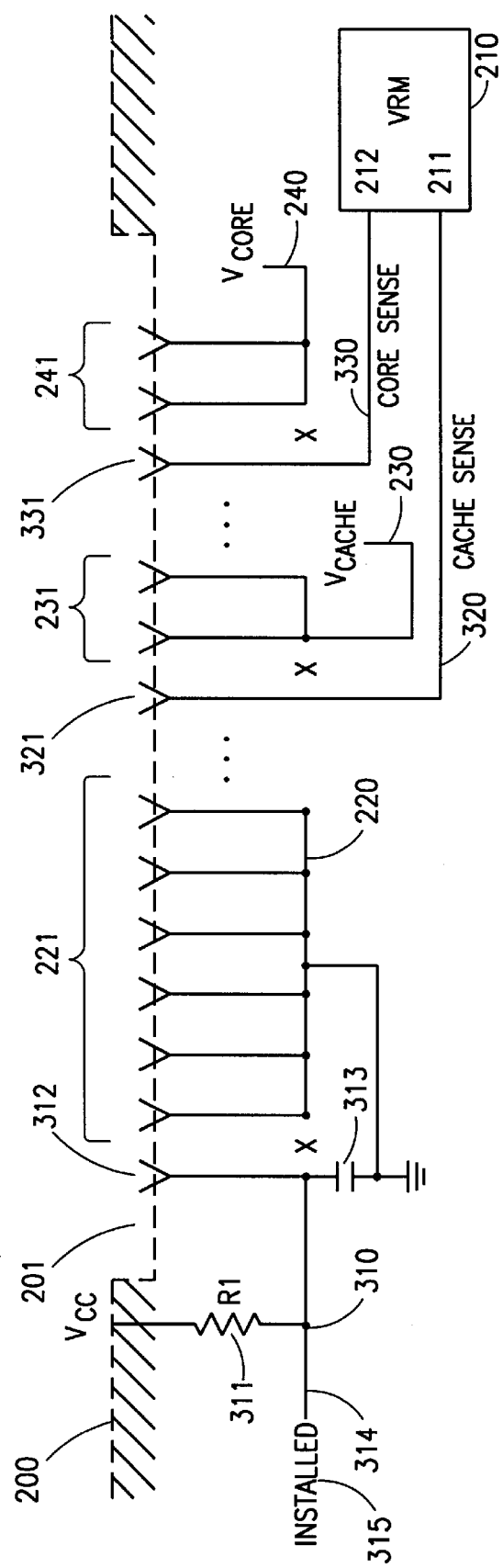
FIG. 3A is a schematic diagram illustrating a circuit including contacts isolated from ground and power contacts and related circuits in accordance with the present invention.

As best illustrated in FIG. 3A, circuit board 200 may be provided with a plurality of ground contacts 221 as would be conventional. However, in accordance with the present invention, signal generating circuit 310 may be used to provide a positive indication of the presence or absence of a processor in socket 201. In order to generate such a signal, at least one of the plurality of ground contacts 221 may be electrically isolated within circuit board 200 from the other ground contacts 221 to form signal contact 312. Further, pull-up resistor 311 may be coupled to signal contact 312 and $V_{CC}$. Filter capacitor 313 may be coupled to signal contact 312 and, in the preferred embodiment, ground plane 220 of circuit board 200 or suitable ground connection having the same ground reference as ground plane 220. Signal line 314 may be coupled to the common node of resistor 311, capacitor 313, and signal contact 312 for providing INSTALLED signal 315 which may be generated as described hereinafter.

With further reference to FIG. 3A of the drawings, improved voltage regulation by VRM 210 may be achieved by isolating, from a plurality of power contacts 231 associated with supply voltage $V_{CACHE}$ 230, at least one cache voltage sense contact 321. Similarly, at lease one core voltage sense contact 331 may be isolated from a plurality of power contacts 241 associated with supply voltage $V_{CORE}$ 240. Cache and core voltage sense contacts 321 and 331 may further be coupled directly to VRM 210 at sense terminals 211 and 212 respectively. In such a manner, improved sensing can be accomplished as described in greater detail hereinafter.

Figure 3B:
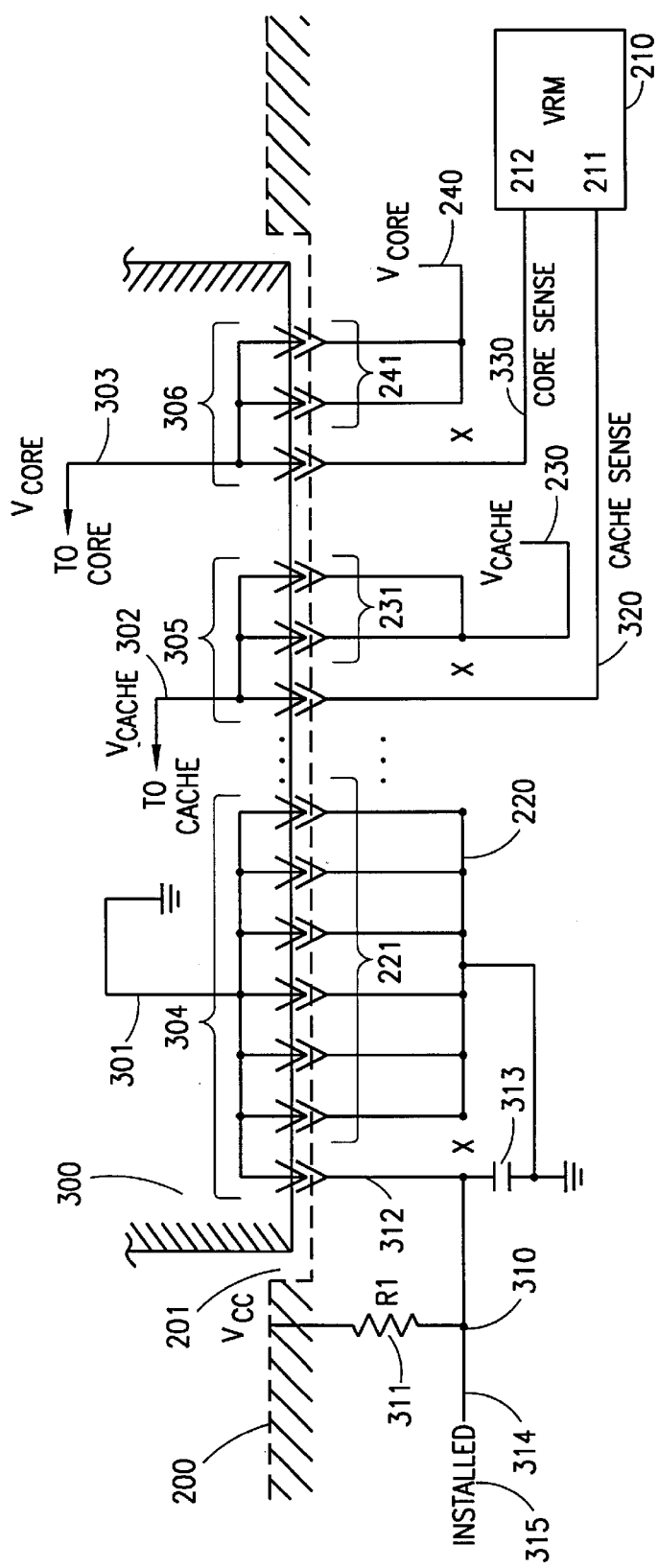
FIG. 3B is a schematic diagram illustrating a circuit including contacts isolated from ground and power contacts and an installed processor in accordance with the present invention.
Figure 3C:
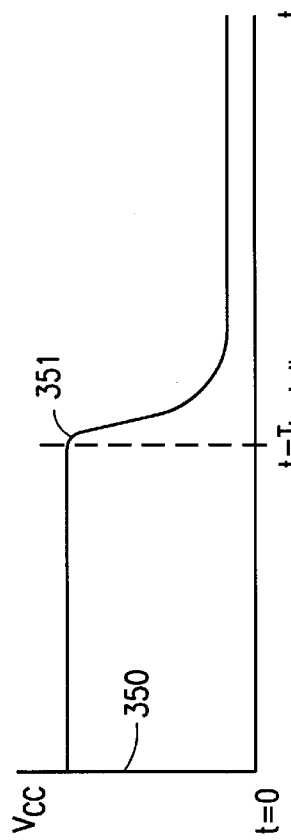
FIG. 3C is a graph illustrating the state of an exemplary INSTALLED signal during circuit operation in accordance with the present invention.

A better understanding of the generation of INSTALLED signal 315 and improved voltage regulation may be had with reference to FIG. 3B of the drawings. Processor 300 may be a typical high performance processor used alone or in a multi-processor computer system 100 as shown in FIG. 1. Circuit board 200, as previously described, may be equipped with socket 201 to accept processor 300 therein. Processor 300 may be secured with mechanical assistance provided by a cartridge or similar package not shown, or through solder connections. Further, processor 300 may be electrically coupled to circuit board 200 using a variety of methods known and commonly used in the art such as 320 pin grid arrays or simple contact arrays or the like. To provide ground connection to ground plane 220 of circuit board 200, ground contacts 304 may be coupled internally to electrical ground circuit or substrate 301 of processor 300. In making the connection between contacts 304 and corresponding contacts 221 of ground plane 220, signal contact 312 is now coupled through processor 300 to ground. INSTALLED signal 315 will now be pulled low due to signal line 314 being coupled directly to ground plane 220 or similar ground reference having the same ground reference as ground plane 220 through processor 300. Prior to installing processor 300, INSTALLED signal 315 may be pulled high through resistor 311 since signal line 314 will float when the processor is not installed. This is possible since there is no DC coupling to ground plane 220 until the installation of 300 processor completes the circuit to ground. The operation of INSTALLED signal 315 may best be illustrated in FIG. 3C. The portion of graph 350 from t=0 to $t=T_{install}$ represents processor 300 being absent from circuit board 200 and a resulting high voltage level is seen for INSTALLED signal 315. After installing processor 300 into circuit board 200, represented by $t=T_{install}$ at point 351 on graph 350 and thereafter, INSTALLED signal 315 is pulled to ground as illustrated for as long as processor 300 remains in socket 201.

Referring back to FIG. 3B, processor 300 may be coupled to VRM 210 to provide more accurate voltage regulation for critical processor circuits. To accomplish improved regulation in accordance with the present invention, cache sense line 320 may be coupled to cache voltage line 302 of processor 300 through contacts 305 which are also coupled at contacts 231 to $V_{CACHE}$ 230 to provide the supply voltage. By improving the proximity of cache sense line 320 toward the processor a more accurate voltage level may be sensed and correspondingly regulated by VRM 210 through sense terminal 211 without stray voltage fluctuation not directly associated with processor operation as seen at processor contacts. To improve regulation of processor 300 core voltage, in a manner similar to cache voltage regulation, core sense line 330 may be coupled to core voltage line 303 of processor 300 through contacts 306 which also come into contact at contacts 241 with $V_{CORE}$ 240. While two exemplary supply voltages are shown as being coupled to processor 300, more or fewer voltage supplies may be present and may be regulated in accordance with the present invention.

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A computer system having condition sensing, the computer system including one or more processors having a plurality of contacts for electrically coupling the one or more processors to a circuit board, the computer system comprising:

a first contact isolated from a plurality of ground contacts within a processor socket on the circuit board, the around contacts coupled to a ground circuit of the circuit board;

a circuit coupled to the isolated first contact for generating a signal indicating a one of the one or more processors has been installed in the processor socket of the circuit board, the circuit responsive to the isolated first contact being coupled to a corresponding around contact of the one of the one or more processors;

a second contact isolated from a first plurality of voltage supply contacts within the processor socket on the circuit board, the first plurality of voltage supply contacts coupled to a first voltage supply circuit of the circuit board; and a voltage regulator having a first sense line coupled to the second isolated contact, the voltage regulator for providing precise voltage regulation of a first voltage supply associated with a first voltage applied to the one of the one or more processors through the first plurality of voltage supply contacts.

2. The computer system as recited in claim 1, further comprising:

a third contact isolated from a second plurality of voltage supply contacts within the processor socket on the circuit board, the second plurality of voltage supply contacts coupled to a second voltage supply circuit of the circuit board; and a voltage regulator having a second sense line coupled to the third isolated contact, the voltage regulator for providing precise voltage regulation of a second voltage supply associated with a second voltage applied to the one of the one or more processors through the second plurality of voltage supply contacts.

3. A computer system having voltage regulation comprising:

a circuit board;

a VRM coupled to the circuit board, the VRM for providing voltage regulation to a processor, the VRM having a voltage sense line coupled to a contact on the circuit board; wherein the contact is isolated from a plurality of contacts on the circuit board, the plurality of contacts for providing a voltage supply to the processor, wherein a connection is established through the processor between the isolated contact and the plurality of contacts to provide improved voltage regulation of the voltage supply, wherein the VRM further comprises a second voltage sense line coupled to a second contact on the circuit board; wherein the second contact is isolated from a second plurality of contacts on the circuit board, the second plurality of contacts for providing a second voltage supply to the processor, wherein a second connection is established through the processor between the isolated second contact and the second plurality of contacts to provide improved voltage regulation of the second voltage supply.

4. A method for condition sensing in a computer system, the computer system including one or more processors having a plurality of contacts for electrically coupling the one or more processors to a circuit board, the method comprising the acts of:

isolating a first contact from a plurality of ground contacts within a processor socket on the circuit board, the ground contacts coupled to a ground circuit of the circuit board;

generating a signal using the isolated first contact, the signal for indicating a one of the one or more processors has been installed in the processor socket of the circuit board, the signal being responsive to the isolated first contact being coupled to a corresponding ground contact of the one of the one or more processors;

isolating a second contact from a first plurality of voltage supply contacts within the processor socket on the circuit board, the first plurality of voltage supply contacts coupled to a first voltage supply circuit of the circuit board; and sensing, at the isolated second contact, the first voltage supply in a voltage regulator having a first sense line coupled to the second isolated contact, the voltage regulator for providing precise voltage regulation of the first voltage supply associated with a first voltage applied to the one of the one or more processors through the first plurality of voltage supply contacts.

5. The method as recited in claim 4, further comprising the steps of:

isolating a third contact from a second plurality of voltage supply contacts within the processor socket on the circuit board, the second plurality of voltage supply contacts coupled to a second voltage supply circuit of the circuit board; and sensing, at the isolated third contact, the second voltage supply in a voltage regulator having a second sense line coupled to the third isolated contact, the voltage regulator for providing precise voltage regulation of a second voltage supply associated with a second voltage applied to the one of the one or more processors through the second plurality of voltage supply contacts.

6. A computer system having condition sensing, the computer system including one or more processors having a plurality of contacts for electrically coupling the one or more processors to a circuit board, the computer system comprising:

a first contact isolated from a plurality of ground contacts within a processor socket on the circuit board, the ground contacts coupled to a ground circuit of the circuit board;

a first means coupled to the isolated first contact for indicating a one of the one or more processors has been installed in the processor socket of the circuit board, the first means responsive to the isolated first contact being coupled to a corresponding ground contact of the one of the one or more processors;

a second contact isolated from a first plurality of voltage supply contacts within the processor socket on the circuit board, the first plurality of voltage supply contacts coupled to a first voltage supply circuit of the circuit board; and a second means coupled to the second isolated contact, the second means for providing precise voltage regulation of a first voltage supply associated with a first voltage applied to the one of the one or more processors through the first plurality of voltage supply contacts and responsive to the application of the first voltage to the second isolated contact.

7. The computer system as recited in claim 6, further comprising:

a third contact isolated from a second plurality of voltage supply contacts within the processor socket on the circuit board, the second plurality of voltage supply contacts coupled to a second voltage supply circuit of the circuit board; and a third means coupled to the third isolated contact, the third means for providing precise voltage regulation of a second voltage supply associated with a second voltage applied to the one of the one or more processors through the second plurality of voltage supply contacts and responsive to the application of the second voltage to the third isolated contact.

\* \* \* \* \*

UNITED STATES PATENT AND TRADEMARK OFFICE
CERTIFICATE OF CORRECTION

PATENT NO.    : 6,263,386 B1
DATED         : July 17, 2001
INVENTOR(S)   : Michael C. Sanders It is certified that error appears in the above-identified patent and that said Letters Patent is hereby corrected as shown below:

Claim 1,
Line 26, delete the word "around" and insert -- ground --, therefor.

Signed and Sealed this

Twenty-ninth Day of January, 2002

Attest:

Attesting Officer

JAMES E. ROGAN
Director of the United States Patent and Trademark Office